United States Patent [19]

Keller et al.

[11] 4,108,714
[45] Aug. 22, 1978

[54] PROCESS FOR PRODUCING PLATE-SHAPED SILICON BODIES FOR SOLAR CELLS

[75] Inventors: Wolfgang Keller, Munich; Konrad Reuschel, Vaterstetten, both of Germany

[73] Assignee: Siemens Aktiengesellschaft, Berlin & Munich, Germany

[21] Appl. No.: 659,958

[22] Filed: Feb. 20, 1976

[30] Foreign Application Priority Data

Feb. 26, 1975 [DE] Fed. Rep. of Germany ....... 2508369

[51] Int. Cl.² .......................... B01J 17/16; B01J 17/18
[52] U.S. Cl. ....................... 156/608; 65/101; 65/193; 156/617 SP; 156/620; 156/DIG. 64; 156/DIG. 88; 156/DIG. 96
[58] Field of Search ....... 156/DIG. 88, 620, DIG. 64, 156/617 SP, 608; 23/273 SP, 273 Z; 65/101, 157, 183, 193, 199, 203, 105

[56] References Cited

U.S. PATENT DOCUMENTS

| | | | |
|---|---|---|---|
| 1,469,379 | 10/1923 | Callard | 156/DIG. 88 |
| 3,124,489 | 3/1964 | Vogel | 156/608 |
| 3,249,404 | 5/1966 | Bennett | 156/608 |
| 3,293,002 | 12/1966 | Spielmann | 156/DIG. 88 |
| 3,310,384 | 3/1967 | Keller | 156/620 |
| 3,393,054 | 7/1968 | Rupprecht | 156/608 |
| 3,453,352 | 7/1969 | Goundry | 156/608 |
| 3,617,223 | 11/1971 | Boatman | 156/620 |
| 3,650,703 | 3/1972 | Labelle | 156/DIG. 88 |
| 3,701,636 | 10/1972 | Labelle | 156/DIG. 88 |
| 3,877,880 | 4/1975 | Kuhlmann-Schafer | 156/608 |

OTHER PUBLICATIONS

Ciszek, IBM Tech. Disc. Bull., vol. 17, #8, Jan. 1975, pp. 2338-2339.

*Primary Examiner*—Stephen J. Emery
*Attorney, Agent, or Firm*—Hill, Gross, Simpson, Van Santen, Steadman, Chiara & Simpson

[57] ABSTRACT

Molten silicon is controllably fed into a nip between spaced-apart rollers, converted into a wide ribbon of a desired thickness by passing through such nip and then solidified. The solidified silicon ribbon is then severed into plate-shaped bodies of desired dimension for use in the manufacture of solar cells.

6 Claims, 3 Drawing Figures

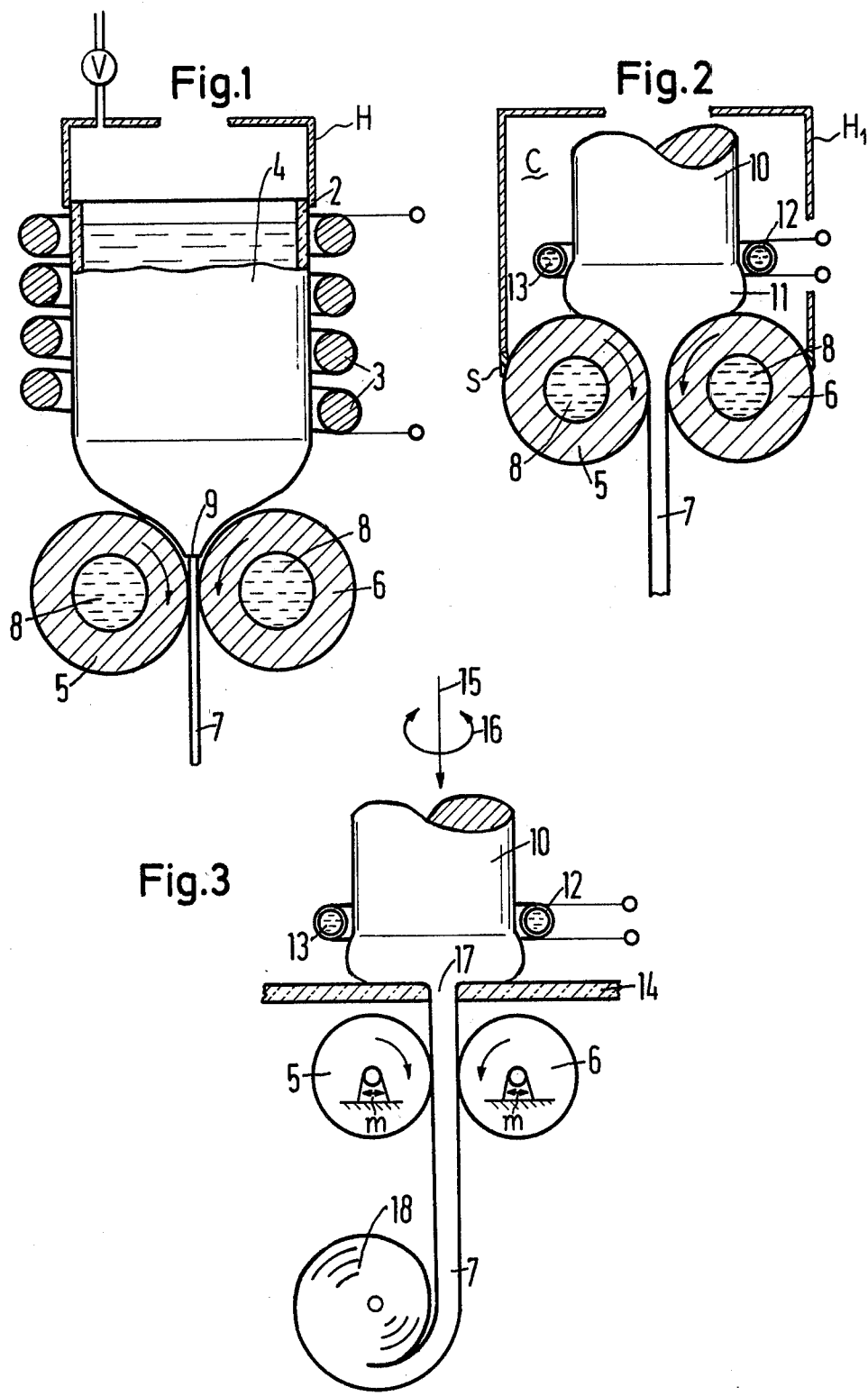

PROCESS FOR PRODUCING PLATE-SHAPED SILICON BODIES FOR SOLAR CELLS

BACKGROUND OF THE INVENTION

1. Field of the Invention

The invention relates to the production of silicon bodies and somewhat more particularly to a process and apparatus for producing plate-shaped silicon bodies useful in solar cell manufacture.

2. Prior Art

In the production of solar cells comprised of large-surface silicon slabs or plates, the cheapest available silicon material is desired. The quality of the silicon material which is used in producing solar cells, especially the crystal quality thereof, is not overly critical, for example, as in instances where silicon material is used to manufacture electrical components.

A typical prior art process of producing silicon slabs for solar cells comprises growing a large cylindrical monocrystal of silicon by slowly withdrawing a seed crystal from a silicon melt and slicing this monocrystalline rod into thin slabs or the like. The flat surfaces of each slab is then polished or otherwise treated to remove surface irregularities.

German Pat. No. 1,555,916 suggests that plate-like silicon bodies may be produced by heating a silicon rod sufficiently to render such rod ductile and subjecting such ductile rod to a rolling or forging process so as to convert the rod into a flat sheet-like body from which silicon plates or the like may be severed. In this process, the starting rod is a monocrystal so that the ultimately produced silicon plates retain at least some monocrystalline characteristics during the transformation of the rod into a ductile condition and during the subsequent rolling or forging. While substantial crystal disorder in the so-processed structures occurs, such disorder is readily removed by subsequent annealing processes.

SUMMARY OF THE INVENTION

The invention provides an economical and efficient method and apparatus of producing silicon plate-like bodies in a simplified manner wherein the crystal structure or order of the resultant body is of subordinate importance.

Generally, the invention comprises converting solid polycrystalline silicon material into a molten form, converting a stream of such molten silicon into a flat ribbon of a desired thickness, solidifying such ribbon and severing the solidified ribbon into plate-like silicon bodies of desired planar dimensions.

In one embodiment of the invention, polycrystalline silicon is melted within an inductively heated crucible having a slit-like aperture at the bottom thereof and a stream of molten silicon is controllably fed through such aperture into a nip between a pair of spaced-apart heat-controlled rollers which convert the molten stream into a ribbon of a desired thickness, which then solidifies and may be severed into desired planar bodies. In another embodiment of the invention, an annular melt zone is generated about a vertically mounted polycrystalline silicon rod positioned above a pair of spaced-apart rollers which pull the molten matter from the melt zone through the nip defined by such rollers and convert it into a ribbon of a desired thickness, which then solidifies and may be severed into desired size bodies. In yet another embodiment, an annular melt zone is generated about a vertically mounted polycrystalline rod which is positioned above a slotted plate and the molten matter within the melt zone is forced through the slot of the plate and into a nip defined between a pair of spaced-apart heat-controlled rollers which convert the molten stream into a flat ribbon of a desired thickness which may be wound onto a core for storage or immediately severed into desired size silicon bodies.

BRIEF DESCRIPTION OF THE DRAWINGS

FIG. 1 is a partial elevated somewhat schematic view of one embodiment of the invention;

FIG. 2 is a somewhat similar view of yet another embodiment of the invention; and FIG. 3 is a partial cross-sectional schematic view of yet another embodiment of the invention.

DESCRIPTION OF THE PREFERRED EMBODIMENTS

The invention provides a method and apparatus for producing plate-like silicon bodies which are useful in solar cell manufacture and generally comprises heating polycrystalline silicon sufficiently to achieve a molten mass thereof, converting such molten mass into a flat ribbon of desired thickness, solidifying such ribbon and severing plate-like bodies of desired dimensions therefrom.

The polycrystalline silicon may be in discrete particle form but preferably is in a cylindrical rod form and is heated to the melting point of silicon (about 1410° C.) or slightly above so as to produce a silicon melt. This melt, whether in stream form or otherwise, is then converted into a flat ribbon or sheet of desired thickness, preferably by passing such molten stream through a nip defined between a pair of spaced-apart rollers and then solidified. The solidified ribbon may then be wound onto a supply reel or the like for future use or may be immediately severed into desired size plate-like bodies.

Means for heating polycrystalline silicon to produce a molten silicon mass may take the form of various devices, for example, silicon particles may be placed in an induction-heated crucible and the crucible heated to the melting point of silicon or slightly above so as to produce a molten mass of silicon within the crucible or an annular induction heating coil may be positioned so as to encompass a portion of a polycrystalline silicon rod and upon energization, as by a high frequency current, generate an annular melt zone about the rod.

Means for converting the molten silicon into a flat ribbon generally comprises a forging process performed by a forging apparatus. Preferably, the forging is accomplished by a pair of spaced-apart rollers which may include means for controllably adjusting the space or nip between such rollers so that the thickness of the ribbon produced is of a desired dimension. In addition, the rollers may include a means for controllably adjusting the temperature of the roller surfaces so as to prevent or minimize thermal stress in the silicon material being forged. Means for controlling the spacing between a pair of rollers as well as means for controlling the temperature of a roller surface may be of conventional construction and are well known.

The rollers are provided with at least an outer shell composed of a silicon compatible material, such as silicon or silicon carbide, and the outer surface thereof may be suitably ground and polished to avoid undesirable marking or the like on the silicon ribbon being processed. Preferably, at least the outer surface of the rollers is maintained at a temperature of about 900° to 1300° C., for example, by a heat-exchange fluid circulating within the interior of the rollers. The rollers are controllably rotated at a rate so that the peripheral surface thereof travels at a linear rate of about 30 to 200 cm/min.

The heating and forging (or rolling) steps may occur in a protective gas atmosphere (such as one composed of nitrogen) or in air.

Referring now to the drawing, FIG. 1 illustrates an embodiment of the invention wherein a crucible 2, for example, composed of quartz or other suitable material, is provided with a polycrystalline silicon melt 4. The crucible is annularly encompassed by a heating coil 3 which is operationally coupled with an energy source (high frequency current) for inductively heating the melt 4. The crucible 2 includes a slit-like aperture 9 at the bottom thereof and molten silicon exits through the aperture 9 as a stream. A pair of horizontal and parallelly disposed spaced-apart rollers 5 and 6 are mounted for rotation in the direction indicated by the curved arrows and are positioned below the aperture 9 so as to receive the stream of molten silicon into the space or nip between the rollers 5 and 6. During rotation, the rollers 5 and 6 convert the silicon stream into a wide flat silicon ribbon or band 7 of a desired thickness in accordance with a desired solar cell thickness, generally in the range of about 0.1 to 0.3 mm. The rate of rollers 5 and 6 is adjusted so that the peripheral surfaces thereof travel at a linear rate of about 30 to 200 cm/min. As shown, the rollers 5 and 6 may be hollow cylinders which are composed of a material selected from the group consisting of silicon and silicon carbide or at least the outer surfaces thereof may be composed of a silicon compatible material. A heatexchange fluid 8 may be circulated within the rollers 5 and 6 so as to maintain the temperature of the rollers at about 900° to 1300° C. As the molten silicon stream travels through the nip between the rollers 5 and 6, it solidifies as a macropolycrystal and forms a solid ribbon or band 7, which may be immediately severed into a desired plate-shaped silicon bodies or may be wound onto a storage core of the like for future use.

The metering or controlled feeding of the molten mass or stream fed to the nip between the rollers 5 and 6 may be accomplished by providing a pressure differential between the interior of the crucible and the exterior thereof. For example, a gas-tight cover member H may be secured onto the upper end of crucible 2 and a pressurized gas controllably fed into the crucible so as to force the molten silicon out through aperture 9 at a controlled rate. As shown, the cover member H may comprise a hollow housing which is gas-impermeable and includes a valve controlled gas passageway so that an operator may readily adjust the pressure difference between the gas in contact with the interior of the crucible and the ambient atmosphere surrounding the crucible. In this manner, the amount of molten material required for the production of a certain thickness ribbon may be precisely apportioned.

After solidification, the flat silicon ribbon or band may be severed, for example, by cutting or grinding through only the thickness dimension of such ribbon. No further work along the flat or planar surfaces thereof is required. Alternatively, the solidified silicon ribbon 7 may be wound onto a storage reel or the like for later use.

FIG. 2 illustrates another embodiment of the invention wherein a polycrystalline silicon rod 10 is vertically positioned within a chamber C defined by the interior of a housing $H_1$. Suitable rod support means (not shown) may be provided along the inner top wall of housing $H_1$ to position and support the rod 10. A single turn flat induction heating coil 12 is positioned within the chamber C so as to annularly encompass a lower portion of the rod 10. The coil 12 is operationally coupled to an electrical energy source (not shown) and may have a heat-exchanger fluid 13, such as water, circulating through the interior thereof so as to maintain the coil surface at an appropriate temperature. During operation, coil 12 generates an annular melt zone 11 along the bottom of rod 10. A pair of spaced-apart rollers 5 and 6 are mounted for rotation in the direction shown by the curved arrows and are positioned below the coil 12. The rollers 5 and 6 may be in contact with the lower surface of the melt zone 11. As the rollers 5 and 6 are rotated, the molten silicon within the melt zone 11 is pulled into the nip between the rollers and converted into a flat ribbon of a desired thickness (and it will be appreciated that the width of the nip can be adjusted as desired by simply moving the rollers closer together or further apart by appropriate means, such as the axial support member, not shown, at each end of a roller). The so-produced flat ribbon of silicon solidifies as it passes beyond the nip into a solid silicon band or ribbon 7. A heat-exchanger fluid 8 may circulate through the rollers 5 and 6 to maintain the surface thereof at a temperature somewhat below the temperature of the melt zone 11 so as to prevent thermal stress and aid in solidifying the silicon ribbon. The chamber C may be gas-impermeably so that the melting can occur in a select gas atmosphere. For example, sealing member S such as composed of polytetrafluoroethylene, may be secured along the lower ends of housing H, and be in moving contact with the uptraveling peripheral surfaces of rollers 5 and 6. Of course, other sealing arrangements may also be employed.

FIG. 3 illustrates yet another embodiment of the invention wherein a polycrystalline silicon rod is continuously biased against a quartz plate 14 by means 15. The plate 14 includes a slot 17 through which molten silicon is controllably fed. An induction heating coil 12 is positioned along the lower end of rod 10 so as to generate a melt zone 11, which may be in contact with the plate 14. Means 15 may comprise an upper mounting member which supports rod 10 and is acted upon by a controlled feed mechanism forcing the rod downward at a controlled rate. The molten silicon stream emerges from slot 17 and flows into a nip between a pair of spaced-apart rollers 5 and 6 positioned below the plate 14. The molten stream is forged or rolled into a flat ribbon of desired thickness and, as it passes beyond the rollers 5 and 6, solidifies into a solid silicon sheet or band 7 which may be wound up on a storage cylinder 18. In a preferred form of this embodiment, the rod 10 is rotated about its axis in one or both directions as diagrammatically indicated by arrow 16.

The process of the invention allows one to economically and simply produce silicon in a planar form for use in the manufacture of solar cells without sawing, grinding or polishing steps. As a result, the large material losses (about 50%) which result from the prior art cutting of silicon rods into plate-like bodies is avoided.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention as claimed.

We claim as our invention:

1. A process for producing plate-shaped silicon bodies which are useful in the manufacture of solar cells, comprising:

positioning a vertically orientated polycrystalline silicon rod on a plate having a slot-like aperture therein:

generating an annular melt zone about a portion of said rod which is in contact with said slot-like aperture:

controllably biasing said rod against said slot-like aperture so as to force a stream of molten silicon through said slot-like aperture and into a nip defined by spaced-apart rotating temperature controlled rollers positioned below and in registry with said slot-like aperture so that said nip receives the molten silicon stream and forges such stream into flat ribbon of a thickness corresponding to that of the desired plate-shaped bodies said rollers being maintained at a temperature sufficiently high so as to minimize thermal stress in the silicon; and solidifying said ribbon as it travels beyond said nip.

2. A process as defined in claim 1 wherein said rollers have at least an outer surface thereof composed of a material selected from the group consisting of silicon and silicon carbide.

3. A process as defined in claim 1 wherein said rollers are maintained at a temperature in the range of about 900° to 1300° C.

4. A process as defined in claim 1 wherein said rollers are controllably rotated at a rate so that the peripheral surface thereof travels at a linear rate of about 30 to 200 cm/min.

5. A process as defined in claim 1 wherein said silicon melt is rotated about an axis thereof.

6. A process as defined in claim 1 including winding the solidified silicon ribbon onto a storage reel and removing said ribbon from said reel as needed for the production of plate-shaped silicon bodies.

* * * * *